Dec. 3, 1957 D. MESSNER 2,815,444

REMOTE CONTROL TUNING APPARATUS OR THE LIKE

Filed Aug. 29, 1955

2 Sheets-Sheet 1

DARYLE MESSNER
INVENTOR.

BY Bruce [illegible] Birchard

HIS ATTORNEY

DARYLE MESSNER
*INVENTOR.*

*BY* [signature]

HIS ATTORNEY

United States Patent Office 2,815,444

Patented Dec. 3, 1957

2,815,444

REMOTE CONTROL TUNING APPARATUS OR THE LIKE

Daryle Messner, Whittier, Calif., assignor to Hoffman Electronics Corporation, a corporation of California Application August 29, 1955, Serial No. 531,190

3 Claims. (Cl. 250—20)

This invention is related to remote control tuning apparatus for employment with television receivers and, more particularly, to a new and improved remote control tuning apparatus which may be conveniently attached to an otherwise manually controlled television receiver.

The turret tuners of conventional television receivers are generally operated manually with the rotation of the turret shaft accomplishing channel selection. During the past there have been developed several systems for accomplishing channel selection at a remote point from the television receiver. The desirability for conveniently modifying an otherwise manually operated television receiver so as to provide for remote channel selection has become manifest. The remote control adapter unit affixed to the television receiver should of course be compact, of simple design, lend itself to convenient shaft coupling to the turret tuner, and, in particular, provide convenient access for channel alignment. In addition, the internal modification of the television receiver itself should be held to a minimum.

Therefore, it is an object of the present invention to provide a new and useful remote control tuning apparatus suitable for attachment to and cooperation with a conventional television receiver which is otherwise manually operable.

It is a further object of the present invention to provide a new and useful easily attachable remote control tuning apparatus suitable for cooperation with television receivers which will be simple, compact, inexpensive to manufacture, which require a minimum of rework of the television cabinet and chassis, and which will provide convenient access for channel alignment.

According to the present invention, a remote control turret tuning adapter unit is provided with a motor-driven drive portion adapted for intercoupling with the rotatable turret tuner shaft associated with an otherwise manually operatable channel selector of a conventional television receiver. The power is supplied the channel selector drive motor through input motor leads connectable to an A. C. outlet usually provided in the television chassis. A remote control hand operated assembly is electrically connected through a conventional channel tracking circuit to the drive motor. The adapter unit itself is hinged to provide for selectable drive coupling and for channel alignment access.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figures 1A, 1B:
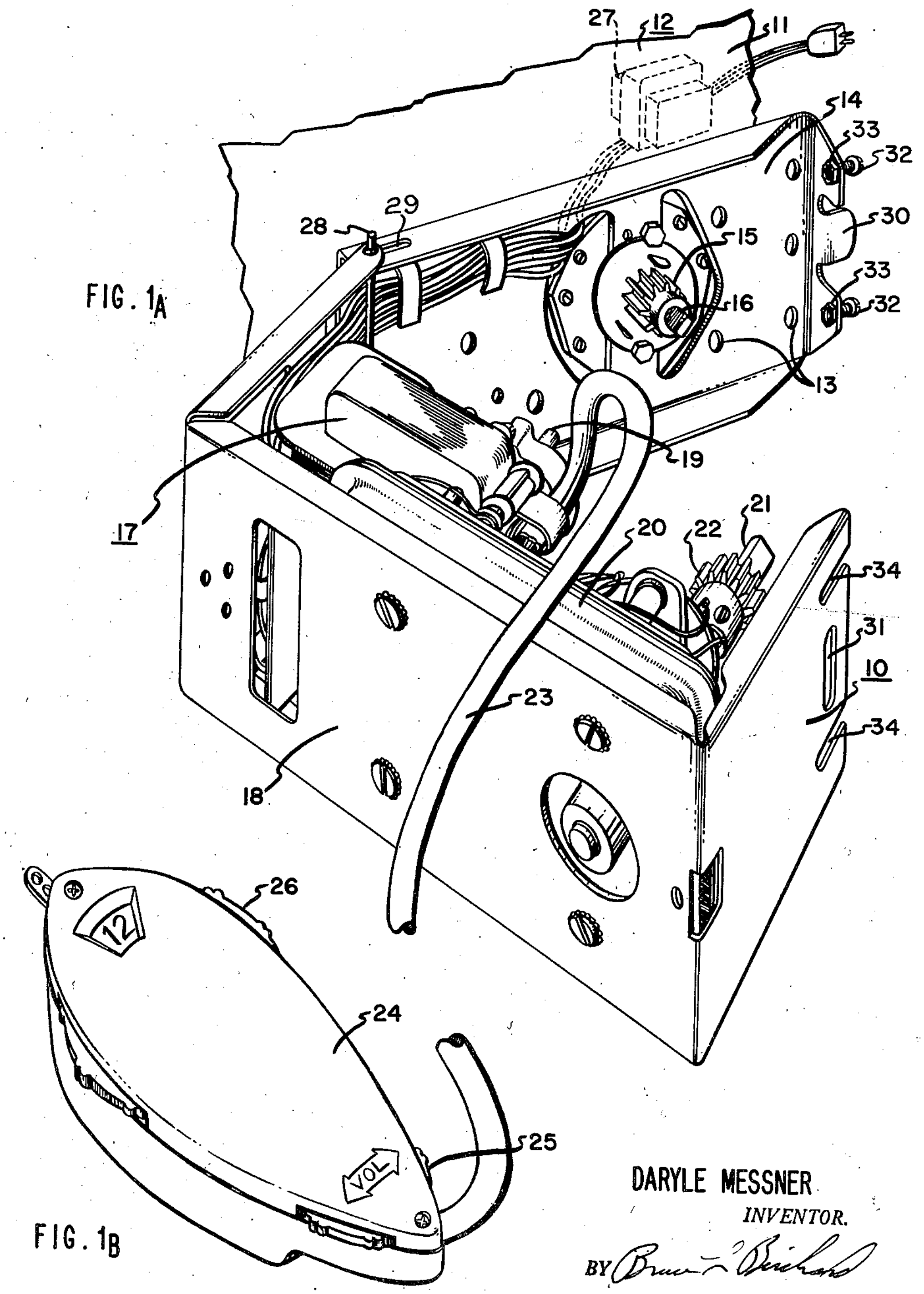
Figure 1A is a perspective view of a remote control attachment unit in its open position as mounted upon the front panel of a conventional television receiver.
Figure 1B is a perspective view of a remote control hand unit which is electrically connected to the remote control attachment unit of Figure 1A.

In Figure 1A, remote control attachment unit 10 is mounted to front panel 11 of television cabinet 12 by attachment screws 13. Rear channel portion 14 of attachment unit 10 is so disposed upon front panel 11 as to permit the cooperation of spur gear 15 with turret tuner shaft 16 of a television receiver chassis. Access apertures are provided on either side of gear 15 to provide accommodation for channel alignment upon the pivotal rotation of channel portion 18 about hinge pin 28 away from channel portion 14. Upper and lower channel slots 29 (lower slot not shown) accommodate the translation of hinge pin 28 to provide for the convenient insertion of tab 30 in slot 31 of channel portion 18. Screws 32 and nuts 33 releasably secure channel portion 18 to channel portion 14 by reason of the cooperation of slots 34 therewith. The upper and lower channel slots permit the selectable meshing of gears 15 and 22 and, with the adjustment of screws 32, proper gear inter-disposition. Channel selector drive motor 17 is mounted upon front channel portion 18 of remote control attachment unit 10. Output drive shaft 19 of motor 17 is mechanically coupled through gear box 20 to shaft 21 upon which gear 22 is mounted. Gear 22 is disposed to cooperate with gear 15 to accomplish the rotation of turret tuner shaft 16 upon energization of motor 17. The motor portion of the tracking circuit (not shown) is electrically coupled through harness 23 to remote control hand unit 24 of Figure 1B.

Figure 2A:
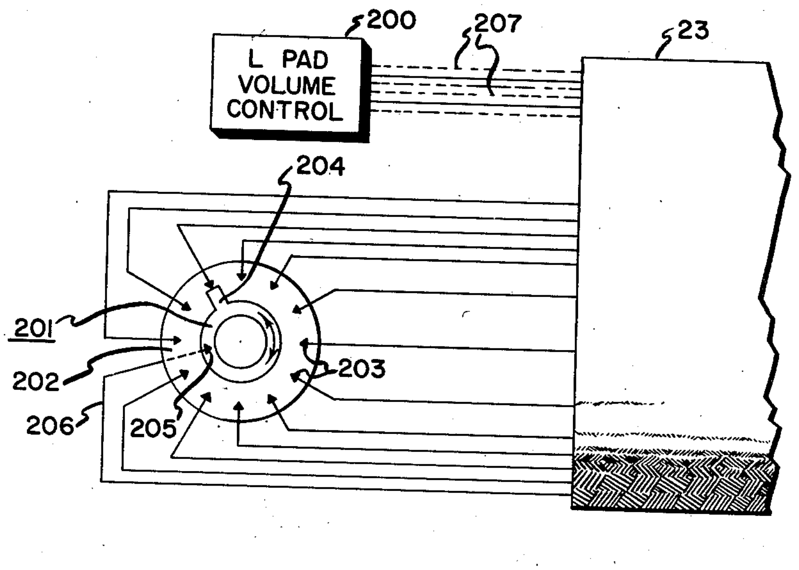
Figure 2A is a schematic diagram partially in block form of the remote control hand unit portion of the tracking circuit utilized in the present invention.
Figure 2B:
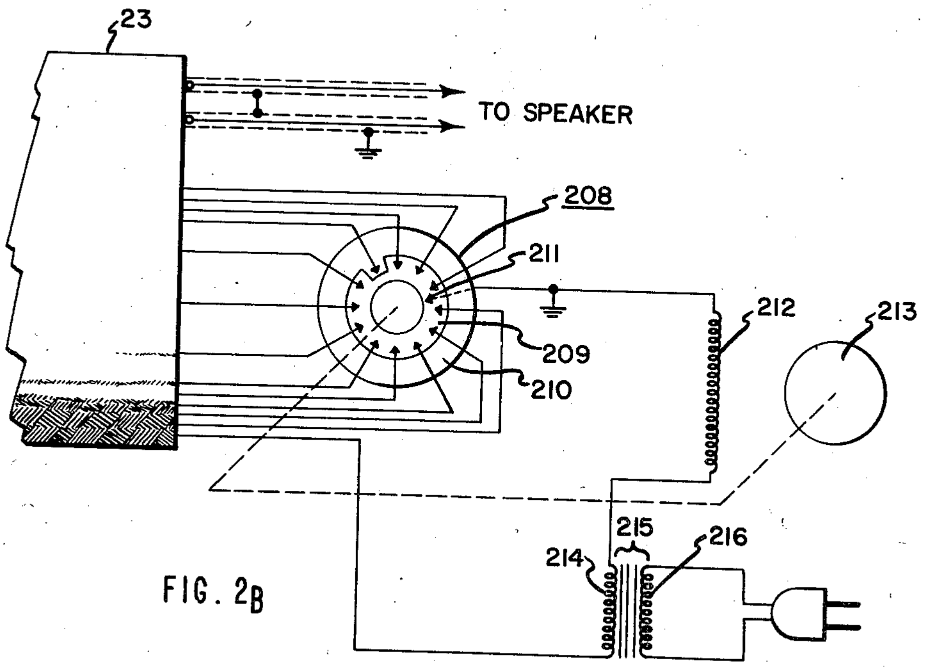
Figure 2B is a schematic diagram of the drive motor portion of the tracking circuit utilized in the present invention.

For purposes of clarity Figures 1B, 2A and 2B will be discussed in conjunction with Figure 1A. Figure 2A shows the remote control hand unit portion of the tracking circuit utilized in this invention. Volume control 25 of Figure 1B may be a conventional L-pad volume control as is indicated by block 200 in Figure 2A. Other types of volume controls may be used equally as well. Channel selector switch 26 is a conventional wafer switch having a rotatable inner member 201 (see Figure 2A) and an outer, insulating switch contact member 202. Channel selector wire lead contacts 203 are circularly disposed about insulating member 202, as shown in Figure 2A, so that by the selectable rotation of inner member 201 a chosen contact will come into electrical contact with protrusion 204. Brush-type electrical contact 205 is made adaptable for electrical connection to wire lead 206. Shielded cables 207 are connected through remote cable 23 to L-pad volume control 200 in hand unit 24. The other ends of shielding cable 207 are connected to the speaker system of the television receiver (not shown) as is indicated in Figure 2B. The remainder of the wire leads from hand unit 24, i. e. the channel selector wire leads, are routed through cable 23 to the motor selector wafer switch 208 of Figure 2B. Wafer switch 208 is composed of inner rotatable conductive member 209 and outer, stationary member 210. Brush-type contacts are provided for cooperation with inner member 209. Inner member 209 itself is notched at one place on its periphery so as to remove electrical contact from the brush-type wire lead contact associated therewith at any particular time. A grounded brush-type contact 211 is provided on the opposite side of wafer switch 208 and remains in continuous electrical contact with inner rotatable member 209. Contact 211 is electrically connected to one end of field winding 212 of drive motor 17 (shown in Figure 1A). Inner rotatable conductive member 209 is physically ganged to armature 213 of drive motor 17 to rotate in accordance with the motion thereof. The remaining end of field winding 212 is electrically connected through secondary 214 of step-down transformer 215 and through remote cable 23 to brush contact 205 in Figure 2A. Primary winding 216 of step-down transformer 215 is coupled to an A. C. input plug adapted for engagement with the A. C. output receptacle usually provided by an associated television chassis. While the inclusion of step-down transformer 215 may very well be desirable (which corresponds to transformer 27 in Figure 1A), since underwriter requirements usually specify that no more than 24 volts be applied to any of the switch contact terminals in the remote control hand assembly, yet conceivably the step-down transformer may be eliminated and motor 17 of Figure 1A may be of the 110 volt A. C. type.

The apparatus shown in Figures 1A and 1B and Figures 2A and 2B operate as follows. The tracking circuit itself is conventional and requires no detailed explanation. It is sufficient to say that upon the rotation of channel selector switch 26 in Figure 1B and the consequent readjustment of protrusion 204 in Figure 2A that the drive motor will rotate, thus causing a rotation through gears 22 and 15 of turret tuner shaft 16 until the notched portion of inner rotatable conductive member 209 of the motor wafer switch shown in Figure 2B removes electrical contact of the motor field coil from the associated wire lead of the selected channel. Volume adjustment of the remote control hand unit in Figure 1B is accomplished by the selective rotation of control 25. The speed of rotation of shaft 21 in Figure 1A upon actuation of the motor drive system will be small by virtue of the gear reduction system in gear box 20 and the chosen low R. P. M. of motor 17.

It is to be noted that no rework of the television chassis itself is required save the mounting of a possibly included step-down transformer for the motor drive system, the input leads of which may be conveniently connected through plug means to any A. C. outlet on the television chassis itself or to an exterior power source. As far as rework of the television cabinet itself is concerned, the only thing necessary is to remove the conventional hand channel selector knob, mount the attachment unit on the front of the panel, and secure the turret tuner shaft (shaft 16 in Figure 1A) to the drive system by means of mounting gear 15 on shaft 16. If desired, the remote control attachment unit may be removed from the television set and the knob replaced upon the turret tuner shaft and this may be done with comparative ease. Of prime importance is the feature of front channel portion 18 being selectably removable from rear channel portion 14 to provide convenient access for channel alignment and also to provide for selectable gear drive decoupling, if desired.

Rather than the tracking circuit which has been chosen for employment in the present invention, or indeed rather than employ any type of tracking circuit, there might also have been employed a simple on-off motor drive circuit to accomplish remote channel selection.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In combination, a television receiver provided with a cabinet, an audio system, and a tuner, said tuner having a tuner shaft; a remote control attachment unit mountable upon the front of said cabinet in proximity with said tuner shaft, said remote control attachment unit including a rear mounting portion removably affixed to the front of said cabinet, a front portion, a drive motor with an output drive shaft, said drive motor being mounted to and interiorly of said front portion, selectably engageable gear means intercoupling said drive shaft with said tuner shaft, said gear means including a first gear mounted upon said tuner shaft and a second gear selectably cooperating with said first gear, said front portion being movable with respect to said rear mounting portion, and means intercoupling said front and rear portions for enabling the selectable adjustment of disposition therebetween, thereby to accomplish the selectable engagement of said first and second gears of said gear means; a remote control harness; a remote control hand unit having a volume control electrically coupled through said harness to said audio system of said television receiver, and a channel selector switch; electrical circuit means intercoupling said channel selector switch with said drive motor and routed at least in part through said harness for supplying power to said motor to rotate said tuner shaft to a selected channel.

2. Apparatus according to claim 1 in which said front portion includes first and second side portions, said first side portion having upper and lower inwardly disposed 90° flanges, said rear portion having upper and lower inwardly disposed 90° flanges, each of said flanges of said rear portion having a corresponding slotted aperture, each of said flanges of said first side portion having a corresponding circular aperture, and said enabling means comprises a translationally displaceable hinge pin disposed pivotally through said slotted and circular apertures; and in which means are provided for selectably affixing said second side portion of said front portion to said rear portion, said rear portion also being provided with at least one access aperture to permit channel alignment.

3. Apparatus according to claim 2 in which said rear portion is provided with an outwardly disposed guide tab, said second side portion of said front portion is provided with a guide slot adapted to cooperate with said guide tab; and in which selectably affixing means comprises adjustable means for compressing said second side portion inwardly toward said rear portion.

References Cited in the file of this patent

UNITED STATES PATENTS

| | | |
|---|---|---|
| 1,905,503 | Robertson | Apr. 25, 1933 |
| 2,122,912 | Levy | July 5, 1938 |
| 2,536,630 | Elmer | Jan. 2, 1951 |

FOREIGN PATENTS

| | | |
|---|---|---|
| 721,933 | Germany | June 22, 1942 |

OTHER REFERENCES

Rider Television Manual, vol. 8, pub. November 26, 1951, Philco TV, pp. 8–1, 8–2, 8–3, 8–4.